US011769615B2

(12) United States Patent
Wozniak

(10) Patent No.: US 11,769,615 B2
(45) Date of Patent: Sep. 26, 2023

(54) SUPERCONDUCTING JOINTS

(71) Applicant: Siemens Healthcare Limited, Camberley (GB)

(72) Inventor: Mariusz Wozniak, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 159 days.

(21) Appl. No.: 17/059,697

(22) PCT Filed: Apr. 9, 2019

(86) PCT No.: PCT/EP2019/058992

§ 371 (c)(1),
(2) Date: Nov. 30, 2020

(87) PCT Pub. No.: WO2019/228698

PCT Pub. Date: Dec. 5, 2019

(65) Prior Publication Data

US 2021/0210266 A1 Jul. 8, 2021

(30) Foreign Application Priority Data

May 30, 2018 (GB) ..................................... 1808760

(51) Int. Cl.
*H01F 7/00* (2006.01)
*H01F 6/06* (2006.01)
(Continued)

(52) U.S. Cl.
CPC ............... *H01F 6/065* (2013.01); *H01F 6/04* (2013.01); *H01F 41/048* (2013.01)

(58) Field of Classification Search
CPC ................ H02G 15/34; H01R 2201/12; H01R 2201/22; H01R 4/68; H01R 4/00;
(Continued)

(56) References Cited

U.S. PATENT DOCUMENTS 3,449,818 A * 6/1969 Chase .................. B23K 35/264 505/928
4,270,264 A * 6/1981 Weisse .................... H01F 6/065 148/516
(Continued)

FOREIGN PATENT DOCUMENTS

CN 101414742 B 4/2011
CN 102971914 A 3/2013
(Continued)

OTHER PUBLICATIONS

International Search Report dated Jul. 18, 2019 for International Application No. PCT/EP2019/058992.
(Continued)

*Primary Examiner* — Shawki S Ismail
*Assistant Examiner* — Lisa N Homza
(74) *Attorney, Agent, or Firm* — Banner & Witcoff Ltd.

(57) ABSTRACT

A superconducting joint arrangement for superconducting magnets, having an elongate joint arranged between superconducting filaments of superconducting wires of one or more superconducting coils, and excess wire provided between the elongate joint and the one or more superconducting coils.

22 Claims, 5 Drawing Sheets

(51) Int. Cl.
*H01F 6/04* (2006.01)
*H01F 41/04* (2006.01)

(58) Field of Classification Search
CPC . H01B 12/00; H01F 6/065; H01F 6/04; H01F 41/048; H01F 6/06; H10N 60/00
USPC .......................................................... 335/216
See application file for complete search history.

(56) References Cited

U.S. PATENT DOCUMENTS

| | | | | | |
|---|---|---|---|---|---|
| 4,558,512 | A * | 12/1985 | Chaussy | H01R 4/68 | 505/925 |
| 4,584,547 | A * | 4/1986 | Thornton | H01L 39/02 | 29/599 |
| 4,625,193 | A * | 11/1986 | Purcell | H01F 6/065 | 505/879 |
| 4,692,560 | A * | 9/1987 | Hotta | H01F 6/06 | 336/62 |
| 4,713,878 | A | 12/1987 | Kumpitsch et al. | | |
| 4,845,308 | A * | 7/1989 | Womack, Jr. | H01B 12/02 | 174/DIG. 26 |
| 4,902,995 | A * | 2/1990 | Vermilyea | G01R 33/3815 | 324/318 |
| 4,924,198 | A * | 5/1990 | Laskaris | G01R 33/3815 | 324/318 |
| 5,215,242 | A * | 6/1993 | Kosky | H01R 4/68 | 505/925 |
| 5,252,800 | A * | 10/1993 | Kosky | C23C 16/458 | 219/85.1 |
| 5,253,413 | A * | 10/1993 | Dorri | H10N 60/80 | 505/925 |
| 5,307,037 | A * | 4/1994 | Woods | H01F 6/065 | 174/15.5 |
| 5,583,319 | A * | 12/1996 | Lieurance | H01R 4/68 | 505/925 |
| 8,253,024 | B2 | 8/2012 | Belton et al. | | |
| 8,315,680 | B2 | 11/2012 | Le Feuvre et al. | | |
| 8,525,023 | B2 * | 9/2013 | Tigwell | G01R 33/3804 | 62/51.1 |
| 8,731,629 | B2 * | 5/2014 | King | H01F 13/006 | 505/925 |
| 2003/0051901 | A1 | 3/2003 | Morita et al. | | |
| 2006/0153579 | A1 * | 7/2006 | Phipps | G03G 15/0863 | 399/24 |
| 2009/0280989 | A1 * | 11/2009 | Astra | G05D 23/1919 | 62/51.1 |
| 2010/0190649 | A1 * | 7/2010 | Doll | H10N 60/80 | 29/599 |
| 2013/0090245 | A1 | 4/2013 | Simpkins | | |
| 2014/0024534 | A1 | 1/2014 | Lakrimi et al. | | |
| 2016/0086693 | A1 | 3/2016 | Lakrimi et al. | | |

FOREIGN PATENT DOCUMENTS

| | | | |
|---|---|---|---|
| CN | 103578681 | A | 2/2014 |
| CN | 204010879 | U | 12/2014 |
| CN | 104319058 | A | 1/2015 |
| CN | 104319508 | A | 1/2015 |
| CN | 104733151 | A | 6/2015 |
| CN | 105825992 | A | 8/2016 |
| JP | S5577109 | A | 6/1980 |
| JP | S58159714 | U | 10/1983 |
| JP | S60175383 | A | 9/1985 |
| JP | S60182673 | A | 9/1985 |
| WO | 01/01048 | A1 | 1/2001 |
| WO | 2010088254 | A1 | 8/2010 |

OTHER PUBLICATIONS

Search Report dated Nov. 20, 2018 for Application No. GB1808760.1.

E.W. Collings and M.D. Sumption, "Stability and AC Losses in HTSC/Ag Multifilamentary Strands" Applied Superconductivity vol. 3, No. 11/12, pp. 551-557, 1995.

* cited by examiner

FIG 1
Conventional
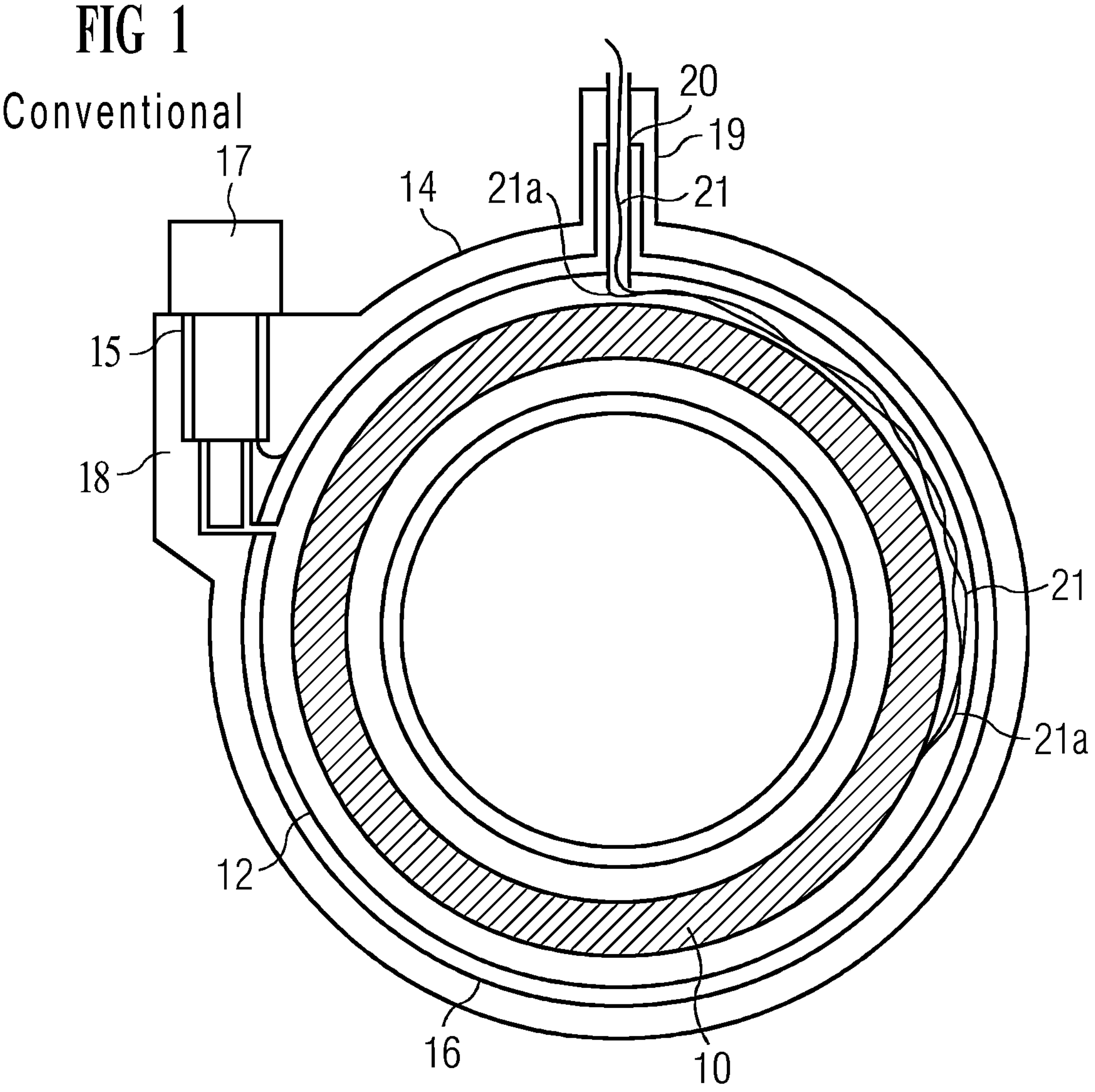

SUPERCONDUCTING JOINTS

TECHNICAL FIELD

The present disclosure relates to an arrangement of superconducting joints, for example in a superconducting magnet for an MRI system. The disclosure also relates to arrangements for storage of excess wire in such superconducting joints.

BACKGROUND

FIG. 1 shows a conventional superconducting magnet for an MRI system. It includes a cryostat including a cryogen vessel 12. A cooled superconducting magnet 10 is provided within cryogen vessel 12, itself retained within an outer vacuum chamber (OVC) 13. One or more thermal radiation shields 16 are provided in the vacuum space between the cryogen vessel 12 and the outer vacuum chamber 13. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

A negative electrical connection 21*a* is usually provided to the magnet 10 through the body of the cryostat. A positive electrical connection 21 is usually provided by a conductor passing through the vent tube 20.

Superconducting magnet 10 comprises a number of coils of superconducting wire, electrically interconnected. These connections, and others required to complete the electrical interconnection of the coils and other electrical equipment, are carefully constructed to ensure a minimum joint resistance and effective cooling. The present disclosure relates to methods and joints useful in such an application.

The methods and joints of the present disclosure provide advantages at least in the fields of efficient cooling of superconducting joints and storage of excess wire. Excess wire is typically desired within the structure of a superconducting joint, to enable the joint to be unmade and remade, if necessary, during the lifetime of the superconducting magnet.

Conventional arrangements for effectively cooling a superconducting joint involve an electrically insulating but thermally conducting interface between a cooling means and the joint. Such conventional arrangements, however, typically have the disadvantages of requiring costly and complex parts which need to be precisely assembled. Added costs and complexity arise from the need to provide electrical insulation and to perform voltage breakdown testing. Examples of such arrangements are disclosed in U.S. Pat. No. 8,253,024, US20130090245, US20140024534, US20160086693, and CN101414742B.

JP S60 182673 A and JP S60 175383 A describe arrangements and methods for making and cooling superconductor joints.

In other known solutions, a cooling pipe containing a cryogen such as gas or liquid helium, neon or nitrogen is provided between the joint and the cryogen vessel or some other cooled component. An electrically insulating but thermally conducting element must be provided to ensure electrical insulation between the cooling pipe and the joint. Such arrangements have disadvantages in requiring costly and complex pipes and vessels with cryogen gas or liquid. Such components must be leak tight and approved for use as pressure vessels. The need to provide electrical insulation between pipes and joints introduces further complexity. An example of such an arrangement is discussed in U.S. Pat. No. 8,315,680.

SUMMARY

An aspect of the disclosure relates to the storage of excess superconducting wire near the joint. It is conventional to coil excess superconducting wire and immobilise it using the same superconducting alloy as used for embedding the joint. Conventionally, excess superconducting wire is coiled inside a metal cup which is filled with liquid superconducting alloy and allowed to cool down to solidify. This creates a large, cylindrical volume of superconducting alloy. However, use of such large volumes of superconducting alloy may create joints which are prone to flux jumps. A large mass of superconducting alloy will require a long cool-down time, and a cup must be provided to contain the alloy. A relatively high-temperature step must be undertaken to melt the alloy and immerse the joint in it. It is also difficult, and may be messy, to extract the excess superconducting wire from the joint cup when a rejoining step is required.

The present disclosure accordingly provides a superconducting joint arrangement with wire storage arrangement to store excess length of the joined superconducting wires in the vicinity of the joint. The arrangements of the present disclosure provide effective cooling of the joint even in the absence of a cooling cryogen bath.

The present disclosure accordingly provides superconducting joints and methods for producing superconducting joints as defined in the appended claims.

BRIEF DESCRIPTION OF THE DRAWINGS

The above, and further, objects, characteristics and advantages of the present disclosure will become more apparent from the following description of certain embodiments, given by way of examples only, in conjunction with the appended drawings, wherein:

FIG. 1 shows an example of a conventional MRI magnet system, comprising superconducting coils within a cryostat;

DETAILED DESCRIPTION

Figure 2:
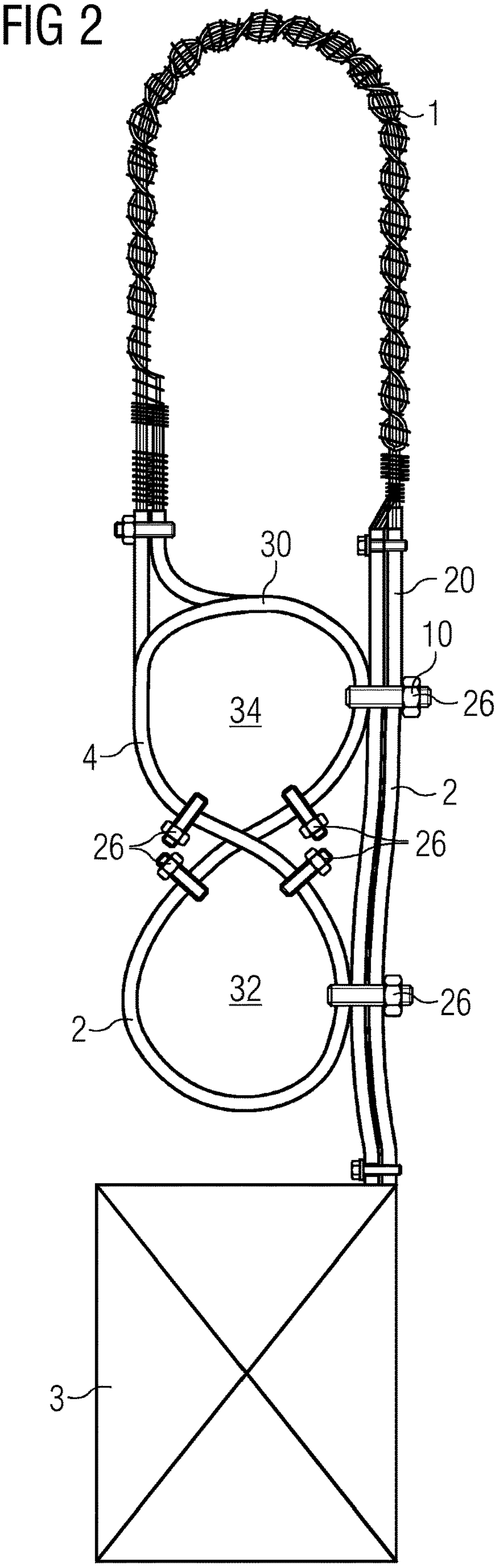
FIG. 2 shows an example of a superconducting joint according to an embodiment of the present disclosure.

The present disclosure accordingly provides a superconducting joint for superconducting magnets, wherein an elongate joint is made between superconducting filaments of superconducting wires of one or more superconducting coils, excess wire being provided electrically between the elongate joint and the one or more superconducting coils, wherein the elongate joint is in thermal contact with at least one of the superconducting wires at a location electrically between the one or more superconducting coils and the excess wire.

a. FIG. 2 schematically illustrates a superconducting joint according to an example embodiment of the present disclosure. Coils of superconducting wire 3 form part of the superconducting magnet. They are cooled by cooling means not illustrated, but which may include cryogen material and a refrigerator as described with reference to FIG. 1. Alternatively, as is the case with some modern superconducting magnet systems, a cryogen vessel containing a bath of liquid cryogen is not provided. Cooling may be provided to the coils of superconducting wire 3 by conduction along a solid thermal bus to a cryogenic refrigerator, for example, or cooling may be by cooling loop: a closed siphon of cryogen which circulates in the loop and is cooled by a cryogenic refrigerator. In such magnet systems, there is no bath of liquid cryogen to maintain joints at superconducting temperatures. The present disclosure aims to provide an effective manner of cooling joints between superconducting wires in a superconducting magnet system, while offering storage of excess superconducting wire required for remaking the joints if necessary.

The joint 1 is made up from two superconducting wires 2, themselves forming part of the coils of superconducting wire 3, and typically one wire each from respective coils of superconducting wire 3. As shown in FIG. 2, 'tails' of wires 2 may be enclosed in respective insulating sleeving 20 over a part of their length. Insulating sleeving may be a PVC tube, a nylon braid or an enamel coating. Joint 1 is formed at the ends of the tails.

Figure 3:
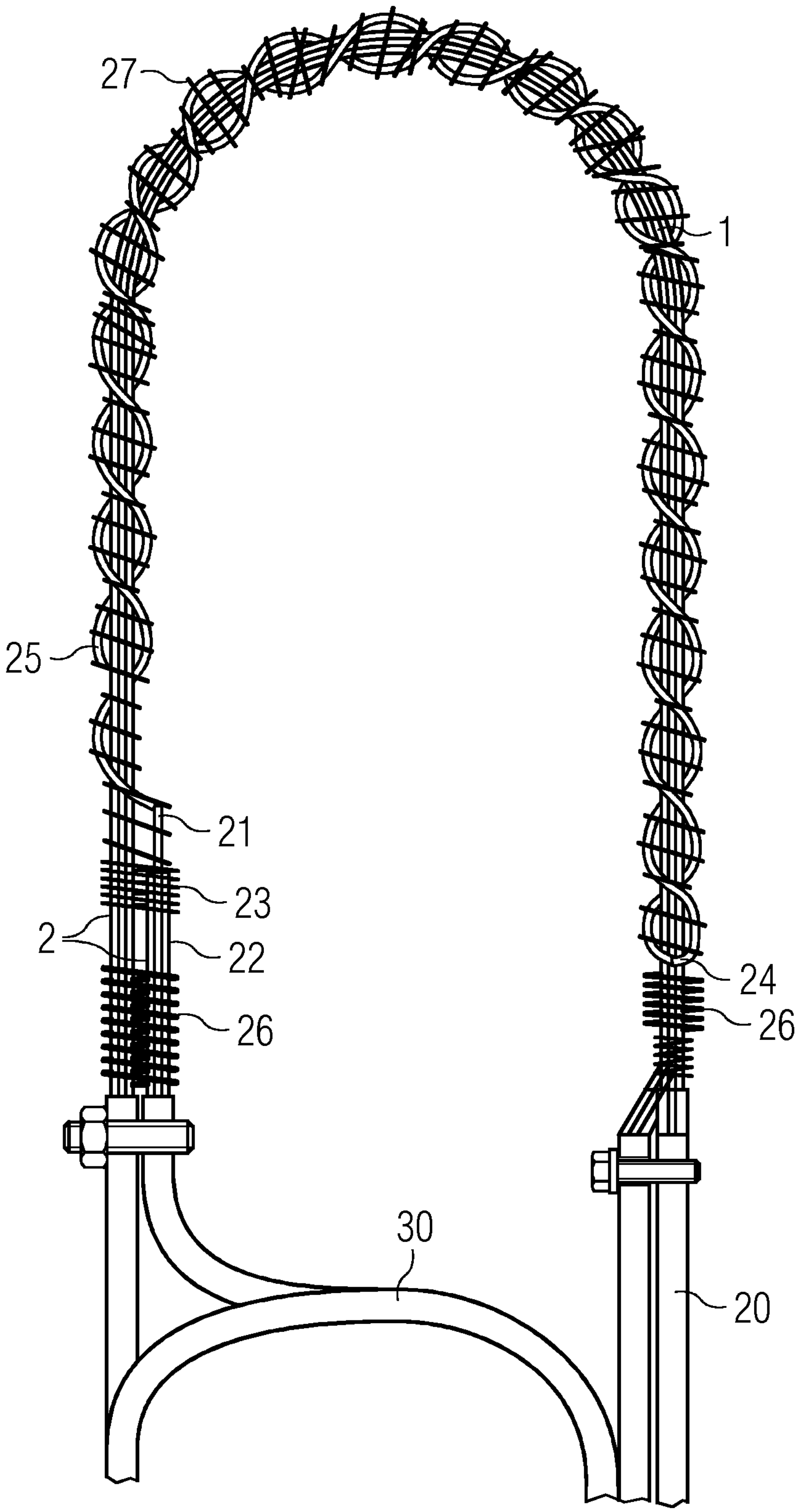
FIG. 3 shows an enlargement of a part of the drawing shown in FIG. 2.

As is well-known in the art, and illustrated in FIG. 3, superconducting wires 2 typically comprise elongate superconducting filaments 21 embedded within a sheath 22 of a conductor such as copper, silver, aluminium etc. At the free end of each wire, the sheath 22 is removed over a significant length such as 10-30 cm, to expose the filaments 21. This may be achieved, for example, by hydrogen fluoride etch, to remove the material of sheath 22 and to clean the surfaces of the filaments 21. The superconducting filaments are thereby exposed over a certain length.

The filaments of the wires to be joined are twisted or plaited together to form elongate superconducting joint 1. The plaited or twisted filaments may then be tinned, for example with indium, to assist surface wetting of the superconducting filaments by superconducting alloy. The elongate superconducting joint 1 may then be coated in a solder, preferably a superconducting solder such as lead-bismuth. The elongate superconducting joint 1 is then placed in thermal contact with at least one of superconducting wires 2, in this example by being wrapped around the superconducting wires 2, electrically between an extremity 23 of the corresponding at least one sheath 22 and the superconducting coil 3. As shown in FIG. 2, the join 1 is thermally attached to the metal sheaths of the wires 2, electrically between the superconducting coil 3 and a first end of the elongate superconducting joint 1. The elongate superconducting joint 1 may be thermally attached to at least one of superconducting wires 2, electrically between an extremity 23 (FIG. 3) of the corresponding at least one sheath 22 and the superconducting coil 3, in a manner other than wrapping, but an effective thermal contact should be established between the elongate joint 1 and the sheath 22 of least one of superconducting wires 2, between an extremity 23 of the corresponding at least one sheath 22 and the superconducting coils 3. In addition to the described thermal contact, the elongate joint 1 should be firmly mechanically held in place, since any freedom to move may cause quench of the joint due to induced eddy currents within the sheath material of the wire. The thermal attachment may be improved by binding the join to the wires, using a thin binding wire 14 such as of copper, aluminium or silver. A good thermal contact is thereby assured between the join 1 and the coil of superconducting wire 3. Any heat arising in the join 1 will be conducted to wires 2 and then along the wires, therefore to coils of superconducting wire 3. Such heat will be carried away by the cooling arrangement provided for cooling the coils of superconducting wire 3.

This arrangement, according to the present disclosure, provides a relatively short heat transfer path from elongate superconducting joint 1 to cooled coils 3. In the absence of the arrangement of the present disclosure, heat would have to pass from the elongate joint 1 along the length of excess wire 30 to reach the cooled coils. The present disclosure provides a much reduced thermal path between the elongate superconducting join and the cooled coils, increasing the effectiveness of the cooling of the elongate superconducting joint and reducing the likelihood of a quench being initiated in the elongated superconducting joint.

The elongate superconducting joint 1 may be soldered to the wires 2, using the same solder which is used in the joint, thereby providing a very effective thermal link between the join and the wires 2, and a very effective mechanical support for the joint. The use of binding wire 14 provides these advantages, to some extent. In certain embodiments, binding wire and solder may be used.

The join 1 is formed over a significant length of the superconducting filaments, for example over 10-30 cm. This will ensure low joint resistance and high current handling capacity.

Preferably, the join 1 is thermally linked to wires 2 relatively close to the coils of superconducting wire 3, ensuring effective thermal coupling between the join 1 and the coils of superconducting wire 3.

In alternative embodiments, the thermal and mechanical contact between the elongate joint 1 and the at least one superconducting wire 2 may be obtained by clamping, pressing or gluing with a suitable adhesive, such as a LOCTITE (RTM) STYCAST (RTM) resin which may be obtained from Henkel Ltd.

The join may be located in a vacuum region, or within a cryogen vessel illustrated in FIG. 1. If positioned within a cryogen vessel, however, cooling may be provided to the joint by boiling or convection of adjacent cryogen material.

As explained above, superconducting coils 3 are cooled by cooling means not illustrated to a cryogenic temperature sufficiently cold to enable superconducting operation of superconducting coils 3. Joint 1, being thermally in contact with sheaths 22 of wires 2, is cooled by thermal conduction along those sheaths to the cooled superconducting coils 3.

Sheath 22 is of a thermally conductive material such as copper, aluminium, silver or a combination of some or all of those metals. Elongate joint 1 may make electrical contact as well as thermal and mechanical contact with the sheaths 22 of superconducting wires 2, as sheaths 22 and elongate joint 1 will be at a same voltage. The thermal conductivity of sheaths 22 carries heat from elongate joint 1 towards the superconducting coil 3.

Figure 7:
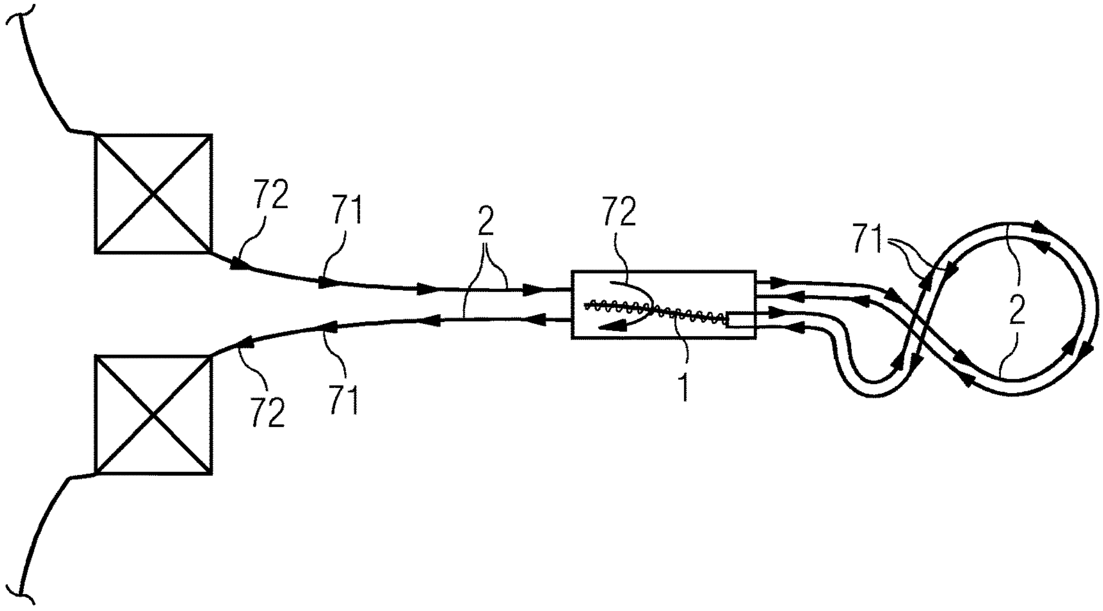
FIG. 7 illustrates current paths through the excess wire and the superconducting joint under certain circumstances.

FIG. 7 illustrates current paths through a superconducting joint of the present disclosure, when in superconducting operation, and following a quench. In normal superconducting operation, current flows along path 71. Path follows one joined superconducting wire 2 to elongated superconducting joint 1, passes through the elongated superconducting joint 1 and out following the other joined superconducting wire 2.

Following a quench, the superconducting wire 2 and the elongate superconducting joint 1 become resistive. Typically, the metal sheath 22 is of lower resistance than the filaments 21 in this state. Current flows along path 72 following a quench. Path 72 follows one joined superconducting wire 2 but along the metallic sheath 22 in preference to the filaments 21. At elongated superconducting joint 1, current preferably transfers from metallic sheath 22 of one wire to metallic sheath 22 of the other wire, through the solder if present and out following the other joined superconducting wire 2.

As illustrated in FIG. 3, the elongate joint 1 may be doubled back at a turning point 24, such that an extremity 25 of the elongate superconducting joint 1 is located closer to the extremity 23 of the sheath 22 than the turning point 24. Care must be taken at turning point 24 that the radius of curvature is not so tight that damage may occur to the superconducting filaments 21 of the elongate joint 1.

Assembly of the joint of the present disclosure may be facilitated by use of binding 26, for example of copper wire, to retain wires 2 together, and/or binding 14, for example of copper wire, to retain the elongate superconducting joint 1 in mechanical contact with sheaths 22 of wires 2. In an embodiment, elongate superconducting joint 1 may be formed from superconducting filaments coated in a solder such as a superconducting solder, then the elongate superconducting joint 1 may be wound around the wires 2, as illustrated in FIG. 2, and bound in place by binding 14.

In an alternative embodiment, a further soldering step may be applied to solder the elongate joint to the sheaths of wires 2, to provide an improved thermal conduction between elongate joint 1 and wires 2. A superconducting solder is preferably used, such as lead-bismuth or indium-tin. Such further soldering step may be performed prior to, following, or in place of, binding of the elongate joint 1 to sheaths 22 of wires 2 by binding 27.

Figure 4:
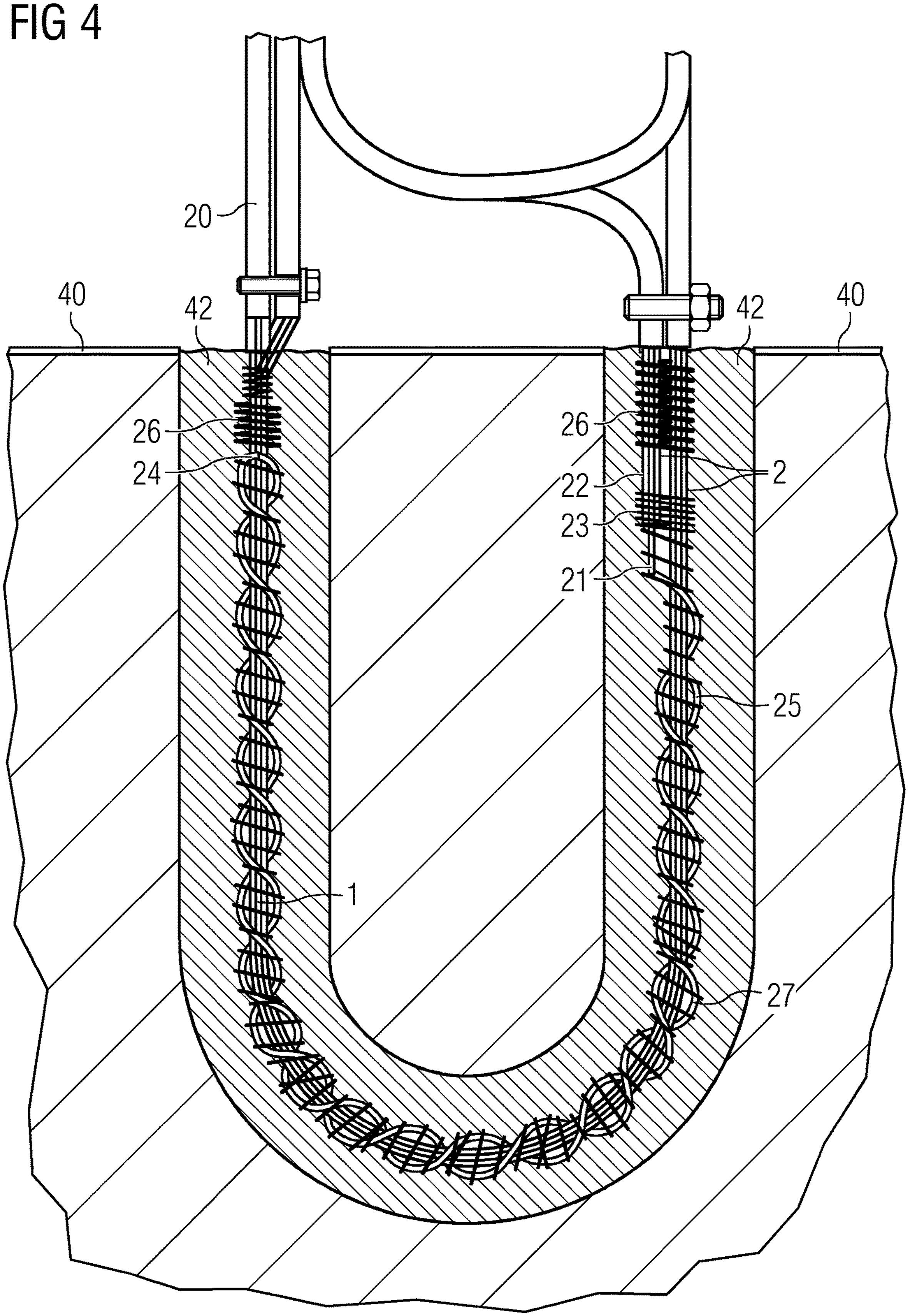
FIG. 4 represents an embodiment in which the joint is cast into a solid block.

In an embodiment, as illustrated in FIG. 4, a mould 40 is provided; the elongate joint 1 and the adjacent part of the at least one superconducting wire 2 are located within the mould, and the mould is filled with a superconducting solder 42 such as lead-bismuth or indium-tin or other superconducting alloy or compound and the elongate joint 1 and the adjacent part of the at least one superconducting wire 2 are cast into a solid block of superconducting alloy or compound 42. In a particular embodiment, the mould 40 is a U-shape mould, for ease of pouring molten alloy or compound but other shapes of mould could be used where appropriate.

According to a feature of the present disclosure, as illustrated in FIG. 2, a length of excess wire 30 is present, forming parts of wires 2 electrically between the superconducting coils 3 and the elongate joint 1. In an embodiment of the disclosure, excess wire 30 may have a length of about 90 cm, being sufficient length to re-make elongate joint 1 up to three times. As illustrated, one or more lengths of sleeving 20 may be placed over the excess wire 30.

Excess wire 30 is provided as a loop, comprising wires 2 electrically between elongate joint 1 and superconducting coils 3. In the illustrated embodiment, and preferably, excess wire 30 is wound into a figure-of-eight configuration, to reduce magnetic field coupling (mutual inductance) between a current loop created by excess wire 30 and current loop created by the main persistent circuit of the MRI system. This will be further explained with reference to FIGS. 5-6.

As is well known in the art, and with reference to the two loops 32, 34 of the figure-of-eight arrangement shown in FIG. 2, a minimum magnetic field coupling will arise when the area enclosed in a first loop 32 equals the area enclosed by a second loop 34. Other embodiments may have three or four loops, provided that the total area enclosed in a first loop and a third loop equals the area enclosed by a second loop and a fourth loop, if any. Electrical insulation should be provided at the cross-over point(s) of the figure-of-eight arrangement, to prevent electrical conduction between the electrical sheaths of respective wires at that point.

Figure 5:
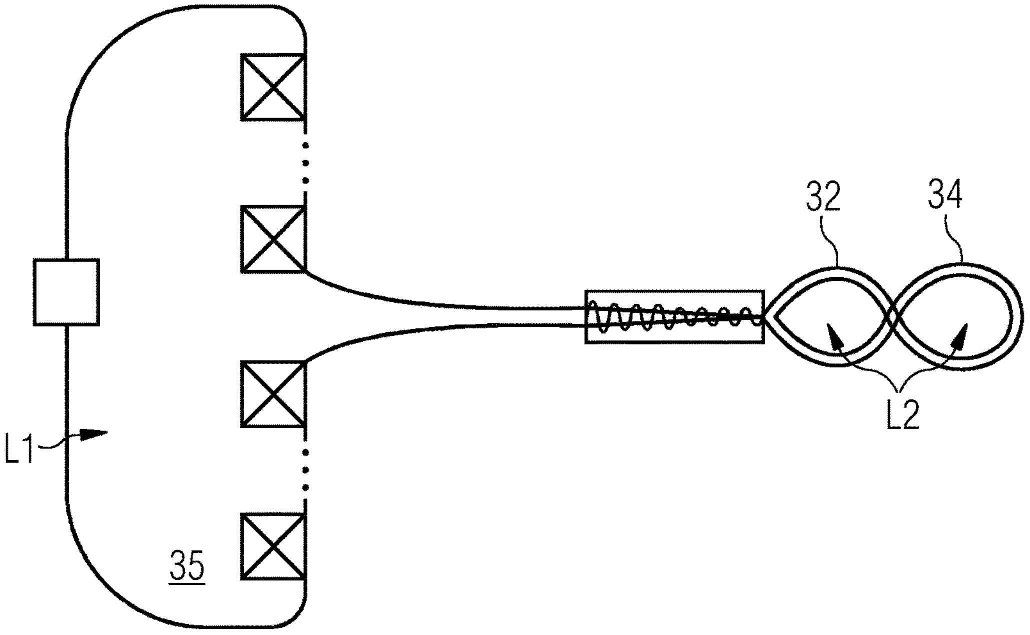
FIG. 5 represents an embodiment of the present disclosure, to explain issues of mutual inductance between coils.
Figure 6:
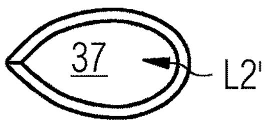
FIG. 6 represents a variant of FIG. 5.

In the illustrated embodiment of FIG. 5, and preferably, first loop 32 encloses a same area as that enclosed by second loop 34. This minimises the mutual inductance between the magnet loop L1 35, comprising the current path representing the whole superconducting magnet, and loop L2 which comprises the summed effect of first loop 32 and second loop 34. Since first loop 32 and second loop 34 are of equal enclosed areas, but carry current in opposing directions, their effects essentially cancel out. FIG. 6 illustrates a single loop L2' 37 which, if used in place of L2 comprising first loop 32 and second loop 34, would result in an unwanted magnetic coupling between loop L1 and loop L2'.

If constructed as above, first loop 32 and second loop 34 of loop L2 are inherently non-inductive, provided that the two wires 2 joined at the elongate superconducting joint 1 are close and parallel to one another.

In other embodiments, use of a single loop L2' 37 as illustrated in FIG. 6 is possible, provided that the single loop L2' 37 is aligned precisely in parallel with the magnetic field generated by magnet loop L1 35. In such case, arrangement of the excess wire 30 into a figure-of-eight loop would not be required as mutual inductance between the magnet loop L1 35 and excess wire of single loop L2' 37 would be close to zero. Care should be taken to avoid mutual induction between single loop L2' 37 and any magnetic field sources external to the magnet.

As a result of small mutual inductance, which may be arranged for as set out above, the net force resulting from the magnetic field of the superconducting magnet on the figure-of-eight arrangement of excess wire 30 is also minimized. This simplifies mounting arrangements and is beneficial.

Preferably, in any case, the loop containing excess wire 30 is formed as a flat, essentially planar structure. In a particular embodiment, the loop containing excess wires 30 is positioned inside OVC 14 such that a magnetic field produced by the superconducting magnet 10 is substantially parallel to the plane of the loop containing excess wires 30, to minimise magnetic coupling between the superconducting magnet 10 and the loop containing excess wires 30.

The effect of other magnetic fields may also be taken into account, such that total local magnetic field is substantially parallel to the plane of the non-inductively-wound windings. Such arrangement minimises the current induced in the non-inductively-wound windings due to external field changes as a result of energisation of the superconducting magnet and other coils associated with the superconducting magnet. For example, gradient coils produce a rapidly varying magnetic field which may have a greater potential for inducing current on the loop(s) of excess wire 30 than any likely variation in the main magnet field.

It is important that the superconducting wire 2 is restrained in position, as far as is practicable. If the superconducting wire were free to move, any movement would take place within the magnetic field of the superconducting coil, and so a voltage would be induced in the wires, which may cause interference with the magnet magnetic field, and could even lead to quench of the magnetic field.

In the illustrated embodiment, this is achieved by use of nylon cable ties 27.

In an alternative embodiment, the excess wire 30 may be wrapped around retaining posts provided for the purpose. Other means for retaining the excess wire in position may be employed, as will be apparent to those skilled in the art.

In an example embodiment, the inventors found that a join according to the present disclosure, in use in a superconducting state, had a resistance of less than $10^{-12}$ ohm, providing a power dissipation of no more than $10^{-6}$ watts at a current of up to 1000 amperes. This low level of power dissipation, combined with high thermal conductivity between the join and the coil of superconducting wire 3 means that the temperature of the join will rise very little.

The phenomenon of flux jumping is discussed in E. W. Collings and M. D. Sumption, "Stability and AC Losses in HTSC/Ag Multifilamentary Strands" *Applied Superconductivity* Vol. 3, No. 11/12, pp. 551-557, 1995.

Flux jumping of magnet joints could lead to the quench of the whole magnet, and so should be avoided as far as reasonably possible.

From adiabatic theory of flux jumping it could be shown that a characteristic flux jumping dimension is proportional to: specific heat C, difference between critical temperature $T_c$ and operating temperature T and inversely proportional to critical current density $J_c$ of superconductor (Equation 1): When size of superconducting alloy is above $a_{FJ}$ flux jumps are possible.

$$a_{FJ} \approx \sqrt{\frac{C \cdot (T_c - T)}{J_c}} \quad \text{(Equation 1)}$$

Often the combination of C, $T_c$, $J_c$ at operating temperature T of superconducting alloy 42 used in superconducting joints requires the characteristic dimension $a_{FJ}$ to be less than 10-20 mm. This dimensional restriction makes it very challenging to store excess length of the joined superconducting wires 30 embedded in superconducting alloy 42.

According to at least one embodiment of the present disclosure, the excess wires 30 are stored in a figure-of-eight loop. Arranging excess wire storage 30 in this way allows for reducing the dimensions of superconducting alloy 42 to below characteristic dimension $a_{FJ}$. In the case of the embodiment of FIG. 4, this means that the dimensions of the superconducting material in directions perpendicular to wires 2 are less than 20 mm and preferably less than 10 mm. Reducing size of superconducting alloy 42 reduces the tendency for flux jumps in the superconducting material 42 of the joint. Limiting the dimension of the superconducting material 42 in the direction of the local magnetic field to below 20 mm and preferably below 10 mm results in adiabatic stability against flux jumps.

The invention claimed is:

1. A superconducting joint arrangement for superconducting magnets, comprising:

an elongate joint arranged between superconducting filaments of superconducting wires of one or more superconducting coils; and excess wire provided electrically between the elongate joint and the one or more superconducting coils, wherein the elongate joint is in thermal contact with at least one of the superconducting wires at a location electrically between the one or more superconducting coils and the excess wire.

2. The superconducting joint arrangement according to claim 1, wherein the elongate joint is in electrical contact with at least one of the superconducting wires at a location electrically between the one or more superconducting coils and the excess wire.

3. The superconducting joint arrangement according to claim 2, wherein the elongate joint is in electrical contact with two superconducting wires at a location electrically between the one or more superconducting coils and the excess wire (30), and wherein, in case of a quench, current is flowable from one of the two superconducting wires to the other of the superconducting wires without flowing through the length of the excess wire.

4. The superconducting joint arrangement according to claim 1, wherein the elongate joint is bound to at least one of the superconducting wires by binding wire.

5. The superconducting joint arrangement according to claim 1, wherein the elongate joint comprises a superconducting solder.

6. The superconducting joint arrangement according to claim 5, wherein the elongate joint is soldered to the at least one superconducting wire.

7. The superconducting joint arrangement according to claim 5, wherein the elongate joint and an adjacent part of at least one superconducting wire are cast into a solid block of superconducting alloy or compound.

8. The superconducting joint arrangement according to claim 7, wherein dimensions of the solid block of superconducting alloy or compound in directions perpendicular to the at least one superconducting wire are less than 20 mm.

9. The superconducting joint arrangement according to claim 8, wherein dimensions of the solid block of superconducting alloy or compound in directions perpendicular to the at least one superconducting wire are less than 10 mm.

10. The superconducting joint arrangement according to claim 1, wherein the excess wire is retained in a figure-of-eight loop configuration.

11. The superconducting joint arrangement according to claim 5, wherein the excess wire is retained in the figure-of-eight loop configuration by a plurality of cable ties.

12. The superconducting joint arrangement according to claim 10, wherein the figure-of-eight loop configuration is essentially planar, and the plane of the figure-of-eight loop configuration is arranged parallel to the magnetic field of a superconducting magnet.

13. A method for forming a superconducting joint arrangement for superconducting magnets, comprising:

providing superconducting wires extending from one or more superconducting coils, each superconducting wire comprising superconducting filaments encased in a thermally conductive sheath;

exposing a length of superconducting filaments by removing the sheath at a free end of each superconducting wire;

forming the superconducting filaments into a joint; and attaching the joint in thermal contact with at least one of the wires at a location electrically between the coils and the joint, wherein a length of excess wire is left between the superconducting coils and the superconducting joint, and the superconducting joint is attached in thermal contact with the superconducting wires at a location between the superconducting coils and the excess wire.

14. A method according to claim 13, wherein the step of attaching the joint in thermal contact with at least one of the wires at a location electrically between the coils and the joint comprises forming an elongate superconducting joint and wrapping the elongate superconducting joint around at least one of superconducting wires, electrically between an extremity of the corresponding at least one sheath and the superconducting coil.

15. A method according to claim 13, wherein the elongate joint is doubled back at a turning point, such that an extremity of the superconducting joint is located closer to an extremity of the sheath than the turning point.

16. A method according to claim 13, wherein the elongate joint is formed from superconducting filaments coated in a solder, and then wound around the wires and bound in place by binding.

17. A method according to claim 13, wherein the elongate joint is soldered to the sheaths of the wires.

18. A method according to claim 17, wherein the elongate joint and an adjacent part of at least one superconducting wire are cast into a solid block of superconducting alloy or compound.

19. A method according to claim 18, wherein dimensions of the solid block of superconducting alloy or compound in directions perpendicular to the at least one superconducting wire are less than 20 mm.

20. A method according to claim 19, wherein dimensions of the solid block of superconducting alloy or compound in directions perpendicular to the at least one superconducting wire are less than 10 mm.

21. A method according to claim 13, wherein the excess wire is wound into a figure-of-eight configuration.

22. A method according to claim 21, wherein the figure-of-eight loop configuration is essentially planar, and the plane of the figure-of-eight loop configuration is arranged parallel to the magnetic field of a superconducting magnet.

* * * * *